United States Patent
Tanaka

(10) Patent No.: US 7,411,988 B2
(45) Date of Patent: *Aug. 12, 2008

(54) SEMICONDUCTOR LASER DEVICE

(75) Inventor: Akira Tanaka, Kanagawa-ken (JP)

(73) Assignee: Kabushiki Kaisha Toshiba, Minato-ku, Tokyo (JP)

(*) Notice: Subject to any disclaimer, the term of this patent is extended or adjusted under 35 U.S.C. 154(b) by 25 days.

This patent is subject to a terminal disclaimer.

(21) Appl. No.: 11/276,242

(22) Filed: Feb. 20, 2006

(65) Prior Publication Data

US 2006/0187989 A1    Aug. 24, 2006

(30) Foreign Application Priority Data

Feb. 21, 2005 (JP) ............................. 2005-044722

(51) Int. Cl.
*H01S 5/00* (2006.01)
(52) U.S. Cl. ............... 372/45.01; 372/43.01; 372/46.01
(58) Field of Classification Search .............. 372/43.01, 372/45.01, 46.01
See application file for complete search history.

(56) References Cited

U.S. PATENT DOCUMENTS

2004/0191938 A1* 9/2004 Ueda et al. .................... 438/21
2005/0281304 A1* 12/2005 Mochida ................... 372/46.01
2006/0165143 A1* 7/2006 Ohno .................... 372/46.015

FOREIGN PATENT DOCUMENTS

| JP | 09-129929 | * | 4/1999 |
| JP | 2002164617 | | 6/2002 |
| JP | 2002270957 | | 9/2002 |
| JP | 2004048079 | | 2/2004 |
| JP | 2919788 | | 2/2006 |

* cited by examiner

*Primary Examiner*—Dung T Nguyen
(74) *Attorney, Agent, or Firm*—Banner & Witcoff, Ltd

(57) ABSTRACT

In various aspects, a semiconductor light emitting device provided between a first edge and a second edge opposite to the first edge and emitting laser from the first edge, may include: a first clad layer of a first conductivity type having a nitride semiconductor; an active layer provided on the first clad layer and having a nitride semiconductor; a second clad layer of a second conductivity type provided on the active layer having a nitride semiconductor and a ridge waveguide, the ridge waveguide having an activation region and a first edge region which is adjacent to the activation region and is extended from the first edge in a direction from the first edge to the second edge; an upper electrode provided on the ridge waveguide in the activation region; and a dielectric layer provided on a side surface of the ridge waveguide in the activation region, wherein the ridge waveguide in the first edge region has a lower activation ratio of a second conductivity type impurity than the ridge waveguide in the activation region.

14 Claims, 10 Drawing Sheets

SEMICONDUCTOR LASER DEVICE

CROSS REFERENCE TO RELATED APPLICATION

This application is based upon and claims the benefit of priority from Japanese Patent Application No. P2005-44722, filed on Feb. 21, 2005, the entire contents of which are incorporated herein by reference.

BACKGROUND OF THE INVENTION

Research and development of a semiconductor laser device for next generation DVDs is proceeding. Generally, a semiconductor laser, which emits 400 nm band wavelength laser, is used and InGaAlN semiconductors are used in the semiconductor laser device for next generation DVDs.

In a conventional InGaAlN semiconductor laser, a double hetero junction is provided on a substrate, and a ridge waveguide, which is formed in an upper clad, is provided.

Generally, in the conventional semiconductor laser device made of the InGaAlN semiconductor, a front edge (emission edge) and a rear edge are mirror surfaces made by cleavage. There are numerous surface states in the front edge and the rear edge, so a non-light emitting recombination occurs. Near the front edge and the rear edge, carrier concentration is decreased and light is absorbed. So heat is generated from the edges and COD (Catastrophic Optical Damage) may occur.

SUMMARY

Aspects of the invention relate to an improved semiconductor laser device. Other aspects relate to an improved method for making a semiconductor laser device.

BRIEF DESCRIPTIONS OF THE DRAWINGS

DETAILED DESCRIPTION OF THE INVENTION

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as follows.

GENERAL OVERVIEW

In one aspect of the present invention, a semiconductor light emitting device provided between a first edge and a second edge opposite to the first edge and emitting laser from the first edge, may include: a first clad layer of a first conductivity type having a nitride semiconductor; an active layer provided on the first clad layer and having a nitride semiconductor; a second clad layer of a second conductivity type provided on the active layer having a nitride semiconductor and a ridge waveguide, the ridge waveguide having an activation region and a first edge region which is adjacent to the activation region and is extended from the first edge in a direction from the first edge to the second edge; an upper electrode provided on the ridge waveguide in the activation region; and a dielectric layer provided on a side surface of the ridge waveguide in the activation region; wherein the ridge waveguide in the first edge region has a lower activation ratio of a second conductivity type impurity than the ridge waveguide in the activation region.

In another aspect of the invention, A semiconductor laser device provided between a first edge and a second edge opposite to the first edge and emitting laser from the first edge, comprising: a first clad layer of a first conductivity type having a nitride semiconductor; an active layer provided on the first clad layer and having a nitride semiconductor; a second clad layer of a second conductivity type provided on the active layer having a nitride semiconductor and a ridge waveguide, the ridge waveguide having an activation region and a first edge region which is adjacent to the activation region and is extended from the first edge in a direction from the first edge to the second edge; an upper electrode provided on the ridge waveguide in the activation region; and a dielectric layer provided on a side surface of the ridge waveguide in the activation region; wherein the ridge waveguide in the first edge region has a lower hydrogen content than the ridge waveguide in the activation region.

First Embodiment

A first embodiment of the present invention will be explained hereinafter with reference to FIGS. 1-10.

Figure 1:
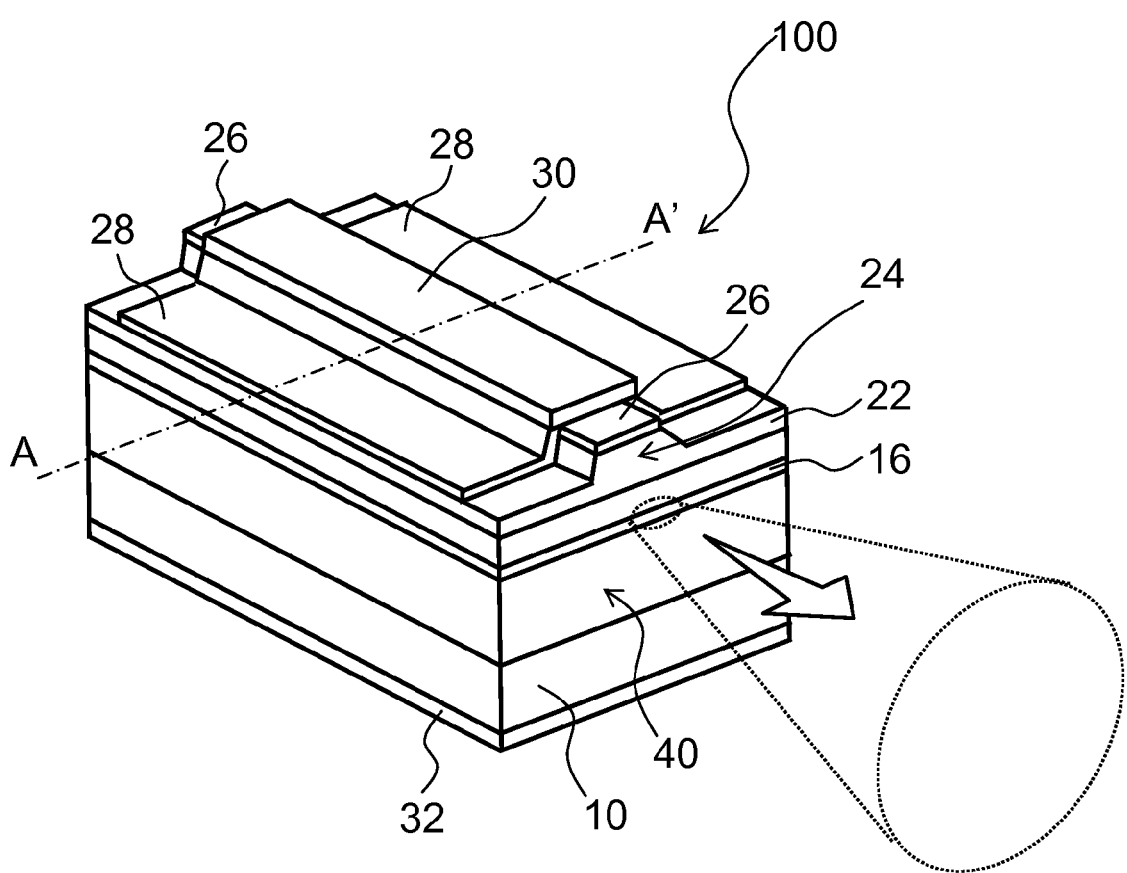
FIG. 1 is a perspective view of a semiconductor laser device in accordance with a first embodiment of the present invention.
Figure 2A:
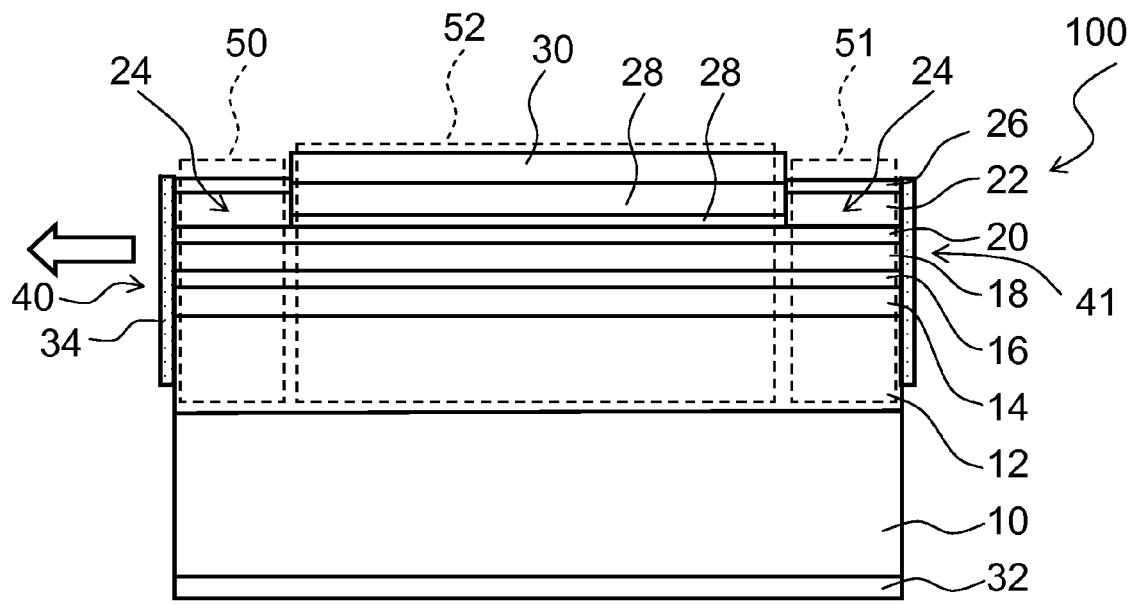
FIG. 2A is a cross sectional view taken along a cavity length of the semiconductor laser device.
Figure 2B:
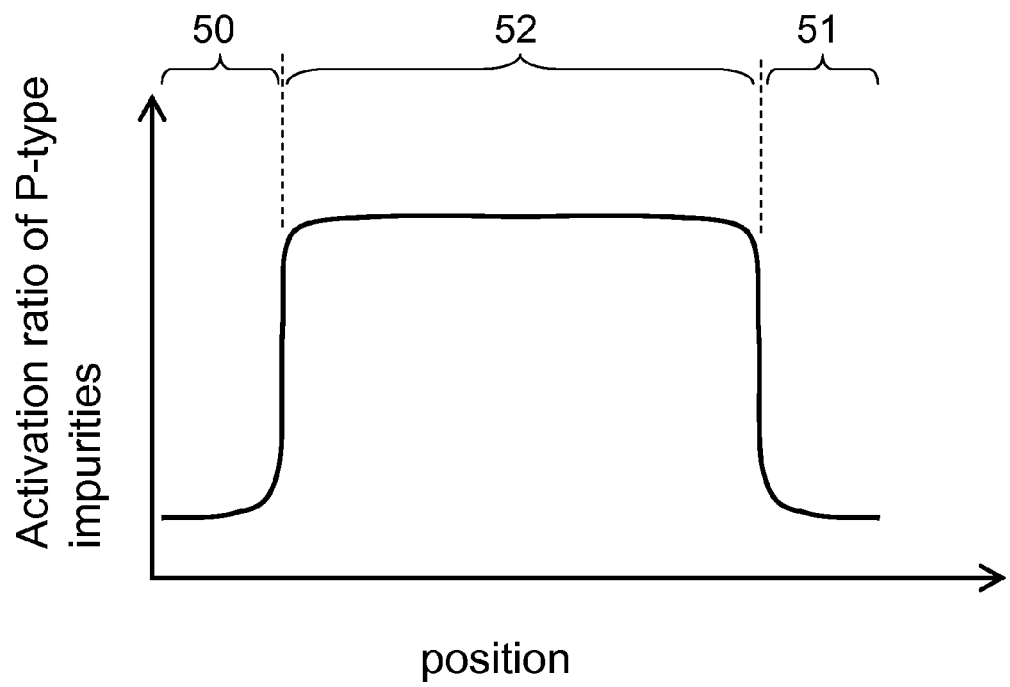
FIG. 2B is a graph showing a distribution of an activation ratio of P-type impurities in P-type semiconductor layers.
Figure 3A:
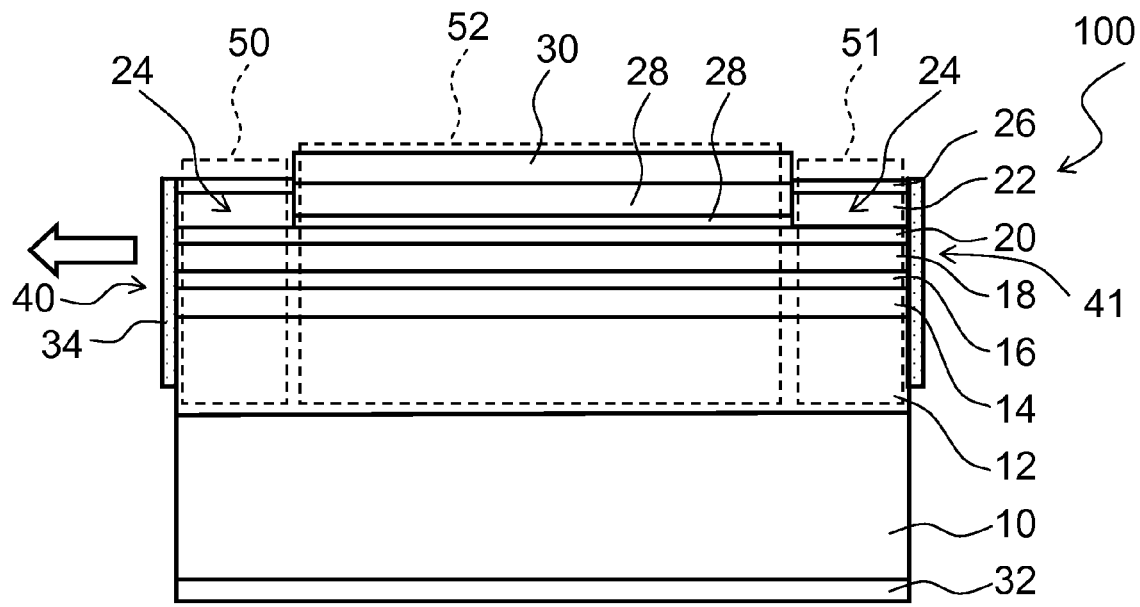
FIG. 3A is a cross sectional view taken along a cavity length of the semiconductor laser device.
Figure 3B:
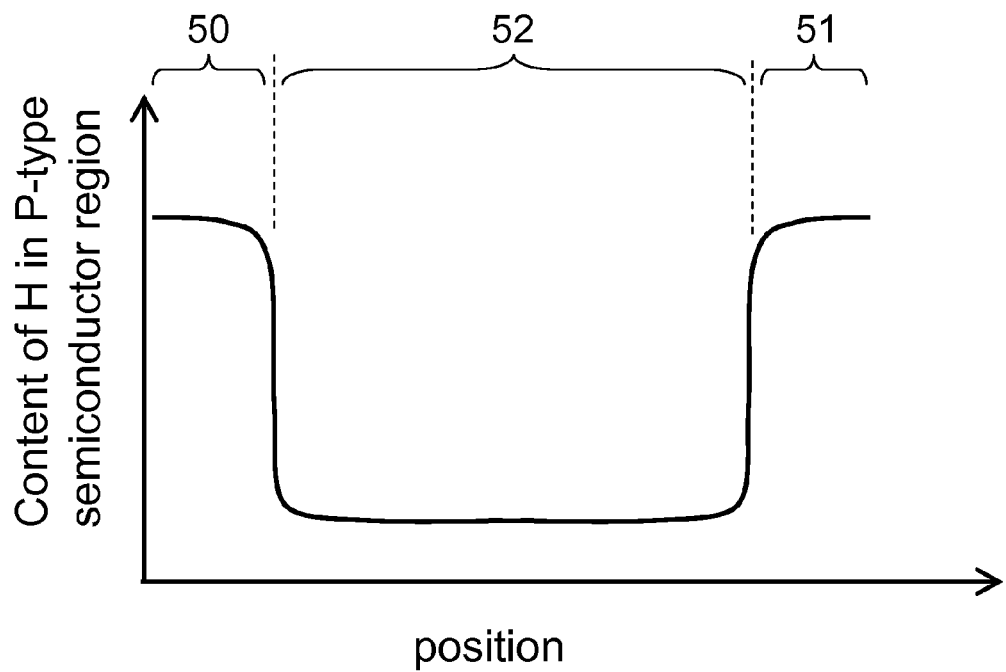
FIG. 3B is a graph showing a distribution of a content ratio of H (hydrogen) in P-type semiconductor layers.
Figure 4:
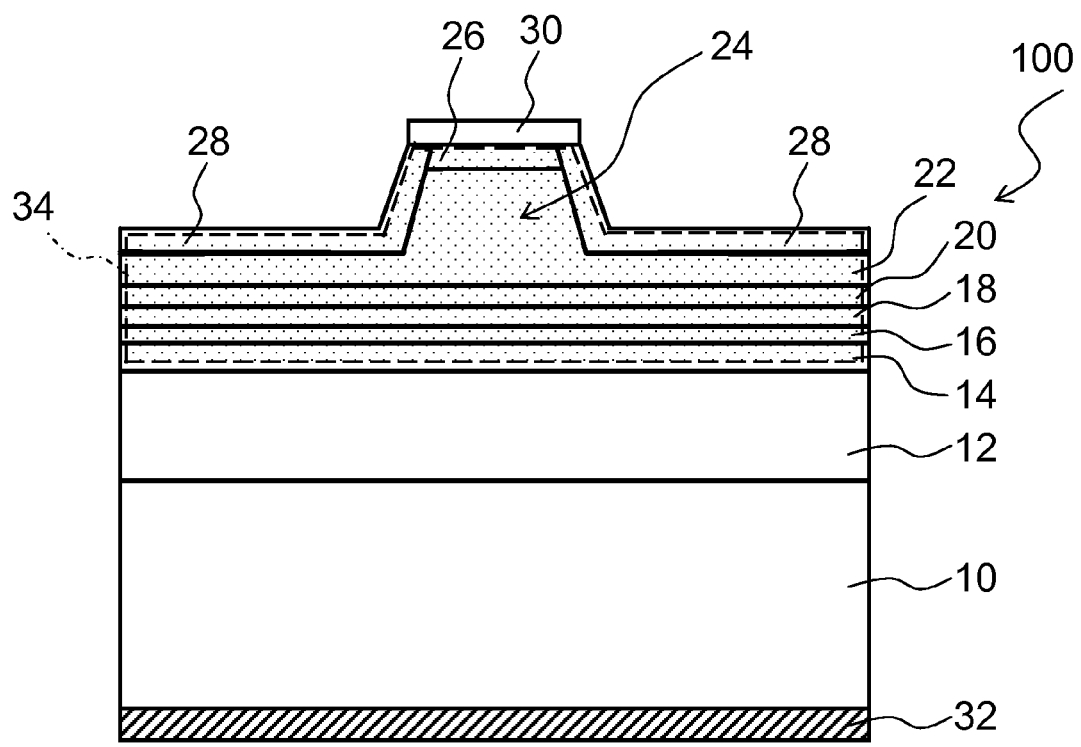
FIG. 4 is a cross sectional view of a semiconductor laser device in accordance with a second embodiment of the present invention.
Figure 5:
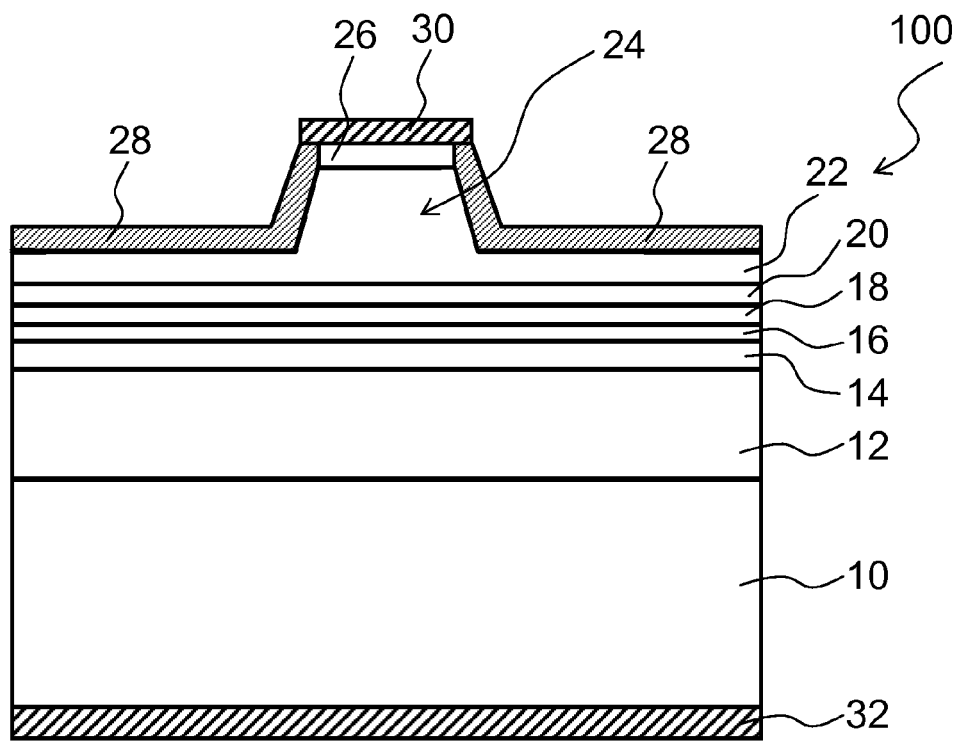
FIG. 5 is a cross sectional view taken along A-A' line of a semiconductor laser device in accordance with a second embodiment of the present invention.

FIG. 1 is a perspective view of a semiconductor laser device 100 in accordance with a first embodiment of the present invention. FIG. 2A is a cross sectional view taken along a cavity length of the semiconductor laser device 100. FIG. 2B is a graph showing a distribution of an activation ratio of P-type impurities in P-type semiconductor layers. FIG. 3A is a cross sectional view taken along a cavity length of the semiconductor laser device 100. FIG. 3B is a graph showing a distribution of a content ratio of H (hydrogen) in P-type semiconductor layers.

As shown in FIG. 1, an InGaAlN double hetero structure, which has an active layer 16 interposed by clad layers, is provided on a substrate 10. A ridge waveguide 24 is provided in an upper clad layer 22 (P-type clad layer). A dielectric layer 28, which has lower refractive index than the ridge waveguide 24, is provided on a side of the ridge waveguide 24. On a top of the ridge waveguide 24, an upper electrode 30 (P side electrode) is provided. On a bottom of the substrate 10, a bottom electrode 32 is provided.

Laser light oscillates in a cavity between a first edge 40 (emission surface) and a second edge 41 (rear surface), when a current is injected from the upper electrode 30 and the active layer 16 is excited. Light is vertically confined between the clad layers, which have a different refractive index from the active layer 16. Light is horizontally confined by the dielectric layer 28, which is provided on the side of the ridge waveguide 24. Laser light is emitted from the first edge 40 with spreading pattern as shown in FIG. 1. This structure is a kind of refractive index guide type semiconductor laser.

In this first embodiment, the upper electrode 30 is not provided in a first region 50 and a second region 51. On the contrary, the upper electrode 30 is provided on the ridge waveguide 24 in an activation region 52. The first region 50 is extended from the first edge 40 and the second region 51 is extended from the second edge 41. The activation region 52 is interposed between the first region 50 and the second region 51 and is adjacent to the first region 50 and the second region 51. In the activation region 52, the active layer 16 is excited and light is generated, since the upper electrode 30 is provided and the dielectric layer 28 is provided on the side of the ridge waveguide 24. On the other hand, in the first region 50 and the second region 51, P-type impurities such as Mg are deactivated by heat treatment in hydrogen ambient. Resistance in the first region 50 and the second region 51 is higher than that in the activation region 52. Thus the amount of current injected in active layer 16 of the first region 50 and the second region 51 is reduced. So light absorption, increase in temperature, and/or decrease of band gap may be reduced. COD (Catastrophic Optical Damage) may be reduced.

As shown in FIG. 2A, in the first region 50 and the second region 51, hydrogen may be introduced into at least one of the contact layer, the P-type clad layer, the P-type optical guide layer, the P-type overflow blocking layer, the active layer, the N-type optical guide layer, and the N-the clad layer.

The contact layer, the P-type clad layer, the P-type optical guide layer, the P-type overflow blocking layer, and the active layer in each of the first region 50 and the second region 51 may have a lower activation ratio of the P-type impurity than those in the activation region 52. So, at least one of the contact layer, the P-type clad layer, the P-type optical guide layer, the P-type overflow blocking layer, and the active layer in each of the first region 50 and the second region 51 may have a higher resistance than those in the activation region 52.

A vertical axis of FIG. 2B shows an activation ratio of P-type impurities in the P-type semiconductor layers.

As shown in FIG. 2B, an activation ratio is higher in the activation region 52 and lower in the first region 50 and the second region 51. In other words, the P-type clad layer 22 or the contact layer 26 in at least one of the first region 50 and the second region 51 has a high resistance. So it is difficult for current to be injected in the first region 50 and the second region 51. So, COD (Catastrophic Optical Damage) may be reduced and a semiconductor laser device that is capable of be operable stably in a high output may be provided.

It is preferable that an activation ratio of the P-type impurity of the P-type clad layer 22 or the P-type contact layer 26 provided in the activation region 52 is 7% or more. On the other hand, an activation ratio of the P-type impurity of the P-type clad layer 22 or the P-type contact layer 26 provided in the first region 50 or the second region 51 is less than 7%. This activation ratio is capable of being obtained by selecting a suitable crystal growing condition. This technique is shown in, for example, Japanese Patent No. 2919788.

A vertical axis of FIG. 3B shows a content of H (hydrogen) in P-type semiconductor layers.

As shown in FIG. 3B, a content of hydrogen is lower in the activation region 52 and higher in the first region 50 and the second region 51. In other words, the P-type clad layer 22 or the contact layer 26 in at least one of the first region 50 and the second region 51 may have a high resistance. So it is difficult for current to be injected in the first region 50 and the second region 51. So, COD (Catastrophic Optical Damage) may be reduced and a semiconductor laser device that is capable of be operable stably in a high output may be provided.

A structure of the semiconductor laser device is explained in detail.

The N-type $Al_{0.05}Ga_{0.95}N$ clad layer 12 (thickness 0.5~2.0 µm), the N-type GaN optical guide layer 14 (thickness 0.01-0.10 µm), $In_{0.15}Ga_{0.85}N/In_{0.02}Ga_{0.98}N$ MQW (Multiple Quantum Well) active layer 16 (thickness of well layer 2~5 nm, the number of wells 2-4, thickness of barrier layer 3-10 nm), the $P^+$-type $Al_{0.2}Ga_{0.8}N$ overflow blocking layer 18 (thickness 5-20 nm), the P-type GaN optical guide layer 20 (thickness 0.01-0.10 µm), the P-type $Al_{0.05}Ga_{0.95}N$ clad layer 22 (0.5-2.0 µm), the $P^+$-type GaN contact layer 26 (thickness 0.02-0.2 µm) are provided on the N-type GaN substrate 10 in this order. The ridge waveguide structure 24, which confines light in horizontal direction, is provided in the P-type AlGaN clad layer 22.

In order to obtain a low threshold current in the semiconductor laser device 100, optical energy is confined between the GaN optical guide layers 14 and 20.

The $P^+$-type overflow blocking layer 18, in which P-type impurity such as Mg is doped, is configured to at least one of block overflowing electron flow from the substrate side and reduce current increasing in a high temperature.

The dielectric layer 28 has a low refractive index than the ridge waveguide 24. For example, the dielectric layer 28 may be made of $SiO_2$ or SiN, or other materials.

The upper electrode 30 may be a metal, which is capable of absorbing hydrogen, such as a single layer, multilayer or an alloy of Ti, V, Nb, Ta, Pd and Er, or combination thereof.

The bottom electrode 32 may be a single layer, multilayer or an alloy of Ti, Pt, Au, Al.

A reflection film 34 is provided on the first edge 40 and the second edge 41 so as to cover the light emission portion. The reflective index of the reflection film 34 is 5%-98% in accordance with its material and thickness.

In case such a metal, which is capable of absorbing hydrogen, is used as the upper electrode 30, it is difficult for hydrogen introduced in the later heat treatment process to remain near the contact layer 30. If the electrode 30 is sintered in hydrogen ambient, hydrogen is absorbed by the metal.

In this embodiment, where such a metal, which is capable of absorbing hydrogen, is provided on the ridge waveguide 24 in the activation region 52, the resistance of the ridge waveguide 24 in the activation region 52 is lower than the clad layer 22 in the first region 50 and the second region 51.

In this first embodiment, the P-type clad layer 22 in the first region 50 and the second region 51 has lower activation ratio of the P-type impurity than the P-type clad layer 22 in the activation region 52. So a resistance in the P-type clad layer 22 in the first region 50 and the second region 51 is higher than a resistance the P-type clad layer 22 in the first region 50.

In this first embodiment, the P-type clad layer 22 in the activation region 52 has lower content ratio of H (hydrogen) than the P-type clad layer 22 of in the first region 50 and the second region 51. So a resistance of the P-type clad layer 22 in the first region 50 and the second region 51 is higher than a resistance the P-type clad layer 22 in the activation region 52.

A manufacturing process of the semiconductor laser device 100 in accordance with this first embodiment will be explained with reference to FIGS. 6-12.

Figure 6:
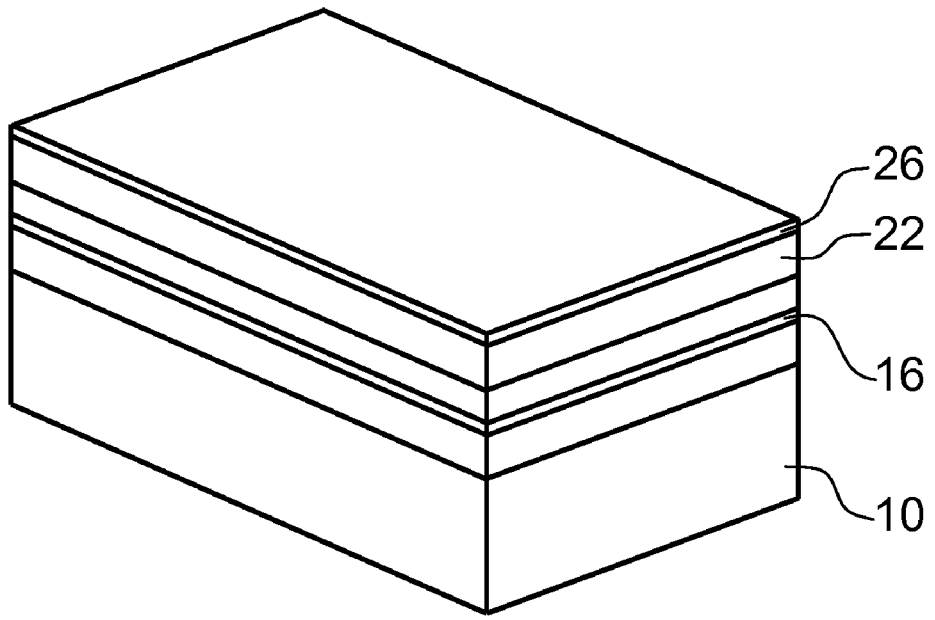
FIGS. 6-11 are perspective views of a semiconductor laser device showing a manufacturing process in accordance with a second embodiment of the present invention.

As shown in FIG. 6, the N-type AlGaN clad layer 12, the N-type GaN optical guide layer 14, the active layer 16, the P$^+$-type AlGaN overflow blocking layer 18, the P-type GaN optical guide layer 20, the P-type AlGaN clad layer 22 and the contact layer 26 is grown on the GaN substrate 10 in this order by, for example MOCVD.

Figure 7:
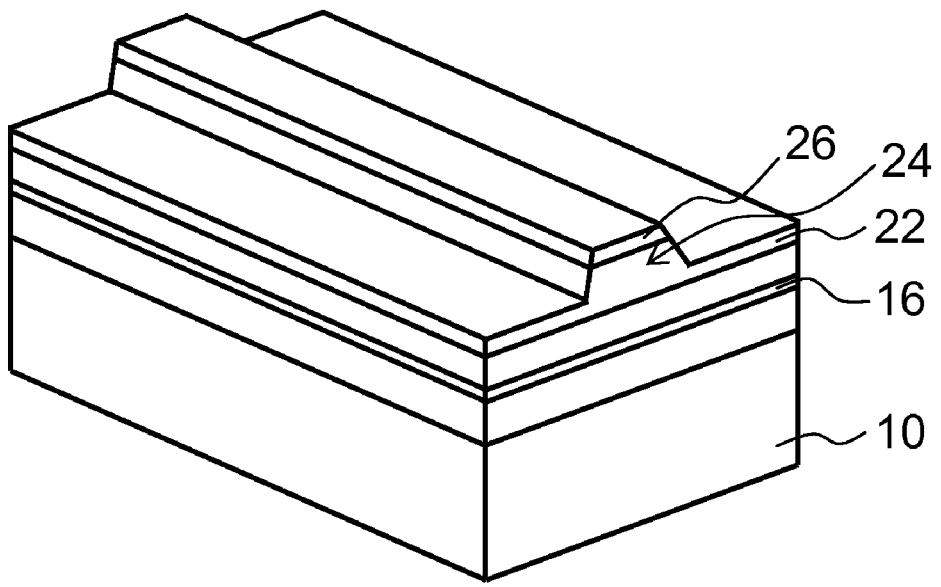

As shown in FIG. 7, the P-type AlGaN clad layer 22 and the contact layer 26 are selectively etched so as to be shaped ridge extending from the first edge 40 to the second edge 41. So the ridge waveguide 24 of the second clad layer 22 and stripe shaped contact layer 26 is created.

Figure 8:
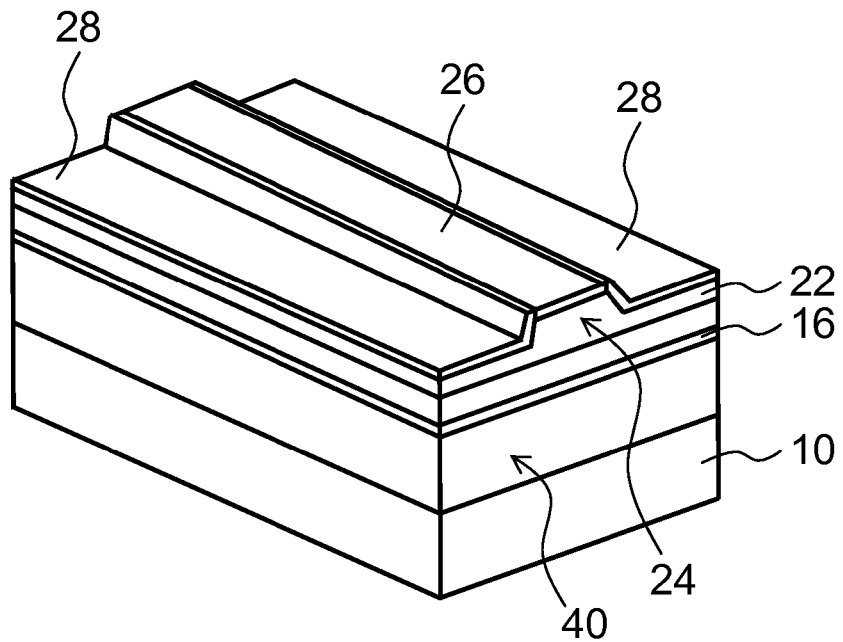

As shown in FIG. 8, the dielectric layer 28 is deposited on an exposed surface of the second clad layer 22 and the contact layer 26. A thickness of the dielectric layer 28 may be 0.2-0.7 µm.

Figure 9:
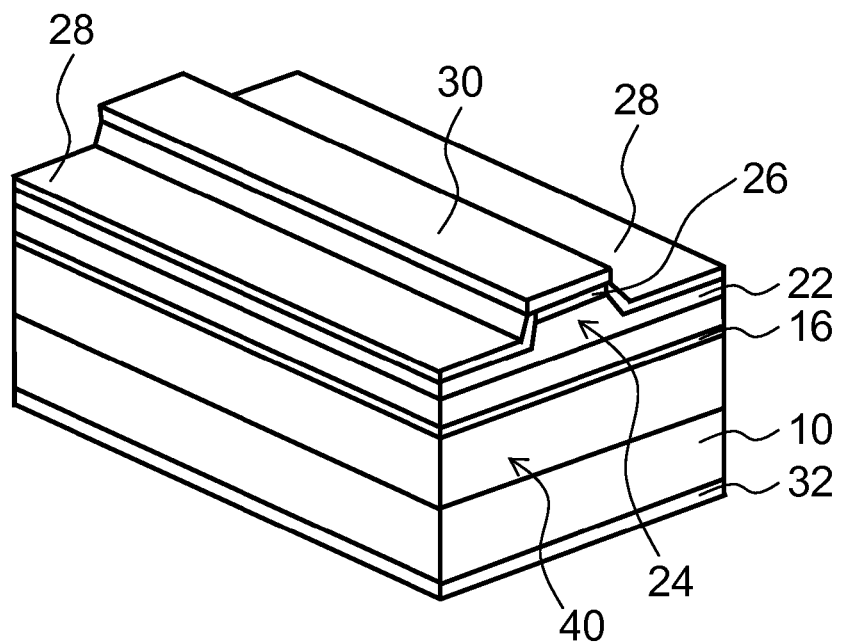

As shown in FIG. 9, the upper electrode 30 and the bottom electrode 32 is provided. The upper electrode 30 may be a metal, which is capable of absorbing hydrogen, such as single layer, multilayer or alloy of Ti, V, Nb, Ta, Pd, and Er, or combination thereof.

Figure 10:
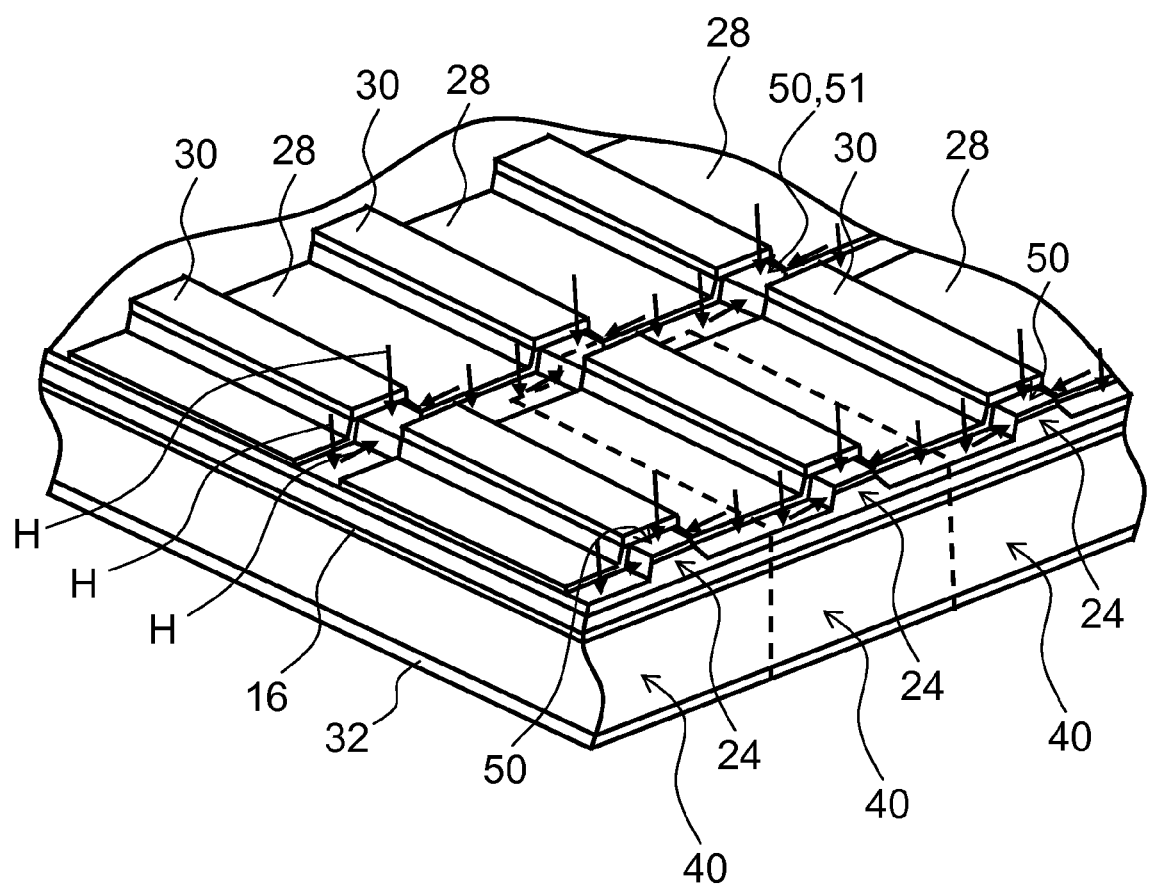

FIG. 10 is a perspective view showing a hydrogen introducing process in a wafer state. The first region 50 and the second region 51 are created. The upper electrode 30 and the dielectric layer 28 are selectively removed in the first region 50 and the second region 51.

Generally, Mg or Zn is used as a P-type impurity in InGaAlN semiconductors. The P-type impurities are deactivated, in case the P-type impurity, Mg is bounded to hydrogen, which is from a material gas, such as NH$_3$, and Mg—H combination is created. A high resistance region is provided despite P-type impurities being doped.

The heat treatment in a hydrogen ambient is performed in a temperature range such as 300-500 Centigrade, preferably 370-430 Centigrade. The hydrogen can be introduced from exposed P-type InGaAlN semiconductors, which the upper electrode 30 is not provided on. The hydrogen is not introduced from the upper electrode 30.

The hydrogen introduced region is provided in the first region 50 and the second region 51. So the P-type impurities are deactivated and a resistance is increased in the first region 50 and the second region 51.

Figure 11:
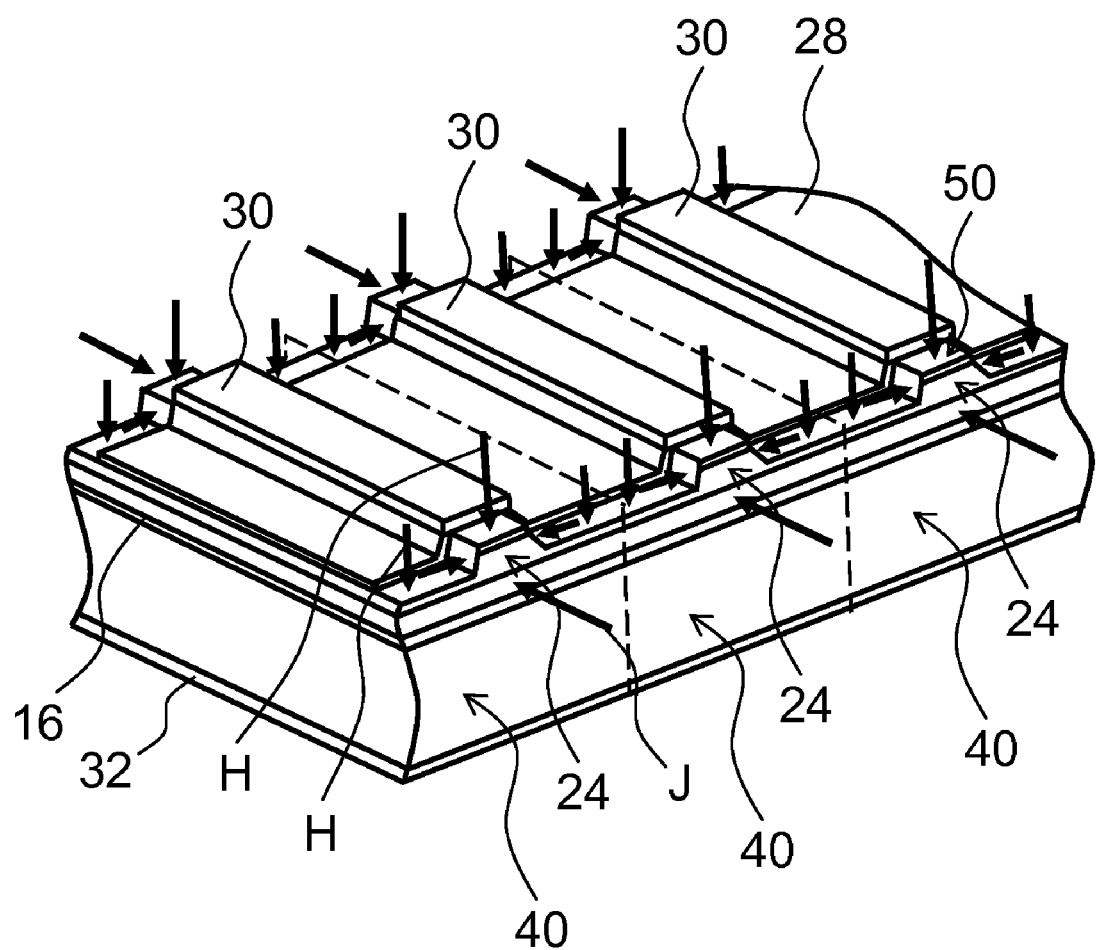

The heat treatment in hydrogen ambient may be operated in a bar state as shown in FIG. 11.

In the semiconductor manufacturing process, the wafer state semiconductor laser is divided into bar state semiconductor laser by cleavage.

As shown in FIG. 11, the first edge 40 and the second edge 41 are exposed to hydrogen ambient. The hydrogen may be introduced as shown in arrow not only H but also an arrow J. So it may be easier for hydrogen atoms to diffuse into the P-type semiconductor layers in this manufacturing process than the manufacturing process as shown in FIG. 10. The larger area of the P-type semiconductor layers is deactivated in the first region 50 and the second region 51, and higher resistance is obtained.

In a structure shown in FIGS. 1-11, both of the first region 50 and the second region 51 is provided in the semiconductor laser device 100. However, it is not necessary for the semiconductor laser device of this embodiment that both of them are provided. The second region 51, which is extended from the rear edge 41, may be removed from the semiconductor laser device. For example, in case a low reflection film (reflection index: about 5%) is provided on the first edge 40 and a high reflection film (reflection index: about 95%) is provided on the second edge 41, in some aspects, a region at and near the second edge 41 are the activation region 52. It may be preferable that a length of the first region 50 and the second region 51 along the cavity length is no less than about 20 µm, which is substantially corresponding to accuracy of the cleavage of the bar state semiconductor laser device. It may be preferable that a length of the first region 50 and the second region 51 along the cavity length is no more than about 50 µm so as to reduce an increasing of threshold current in the semiconductor laser device.

The upper electrode 30 may be provided on the dielectric layer 28 on a side of the ridge waveguide 24. In this case, the upper 30 provided on the side of the ridge waveguide 24 may be used as a bonding pad.

Second Embodiment

A second embodiment is explained with reference to FIG. 12.

A semiconductor light emitting device 200 is described in accordance with a second embodiment of the present invention. With respect to each portion of this embodiment, the same or corresponding portions of the semiconductor light emitting device of the first embodiment shown in FIGS. 1-11 are designated by the same reference numerals, and explanation of such portions is omitted.

Figure 12:
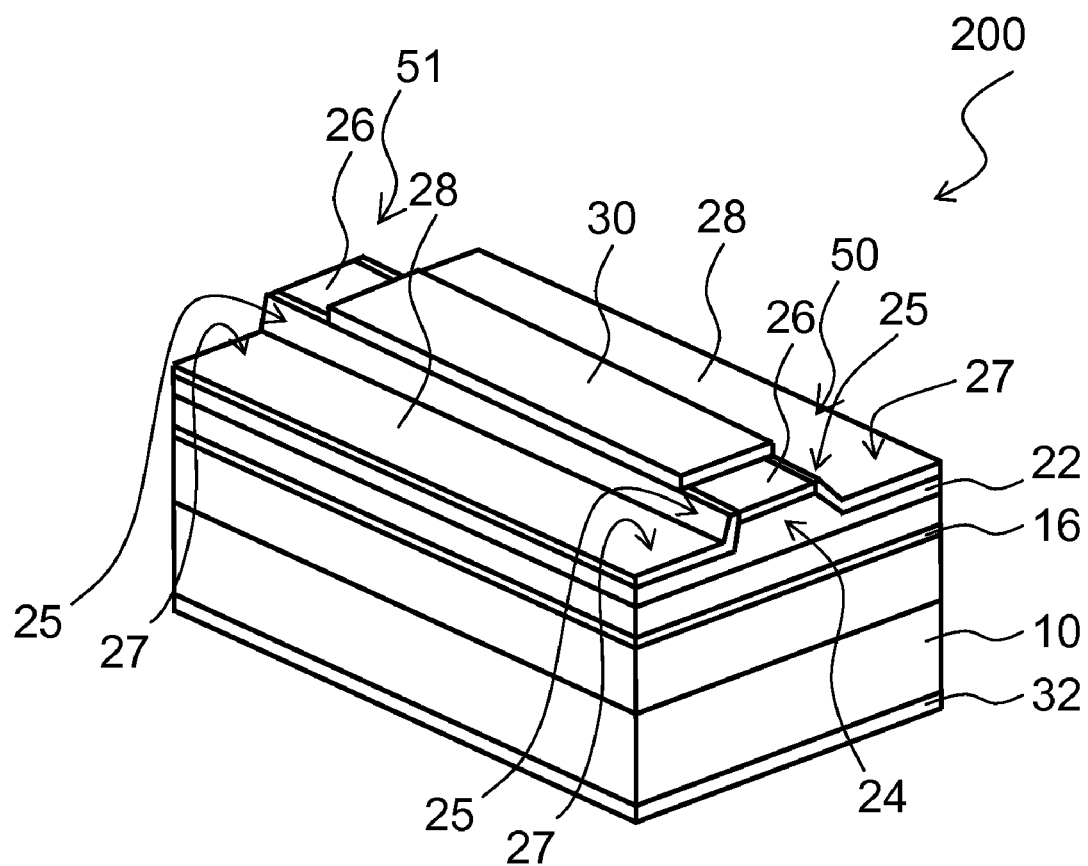
FIG. 12 is a perspective view of a semiconductor laser device in accordance with a second embodiment of the present invention.

FIG. 12 is a perspective view of a semiconductor laser device in accordance with a second embodiment of the present invention.

In this second embodiment, the dielectric layer 28 is provided on the ridge waveguide 24 and the side of the ridge waveguide 24 even in the first region 50 and the second region 51. The light is also confined in the first region 50 and the second region 51 by the dielectric layer 28 in the first and second regions 50, 51. The dielectric layer 28 functions as a protective layer of the below provided semiconductor layers, chemically and physically. The hydrogen atom may be introduced into the P-type clad layer 22 and lower layers, and the P-type clad layer in the first region 50 or the second region 51, even if the dielectric layer 28 is provided on a of the ridge waveguide in the first region 50 and the second region 51.

Third Embodiment

A third embodiment is explained with reference to FIG. 13.

A semiconductor light emitting device 300 is described in accordance with a third embodiment of the present invention. With respect to each portion of this embodiment, the same or corresponding portions of the semiconductor light emitting device of the first or second embodiment shown in FIGS. 1-12 are designated by the same reference numerals, and explanation of such portions is omitted.

Figure 13:
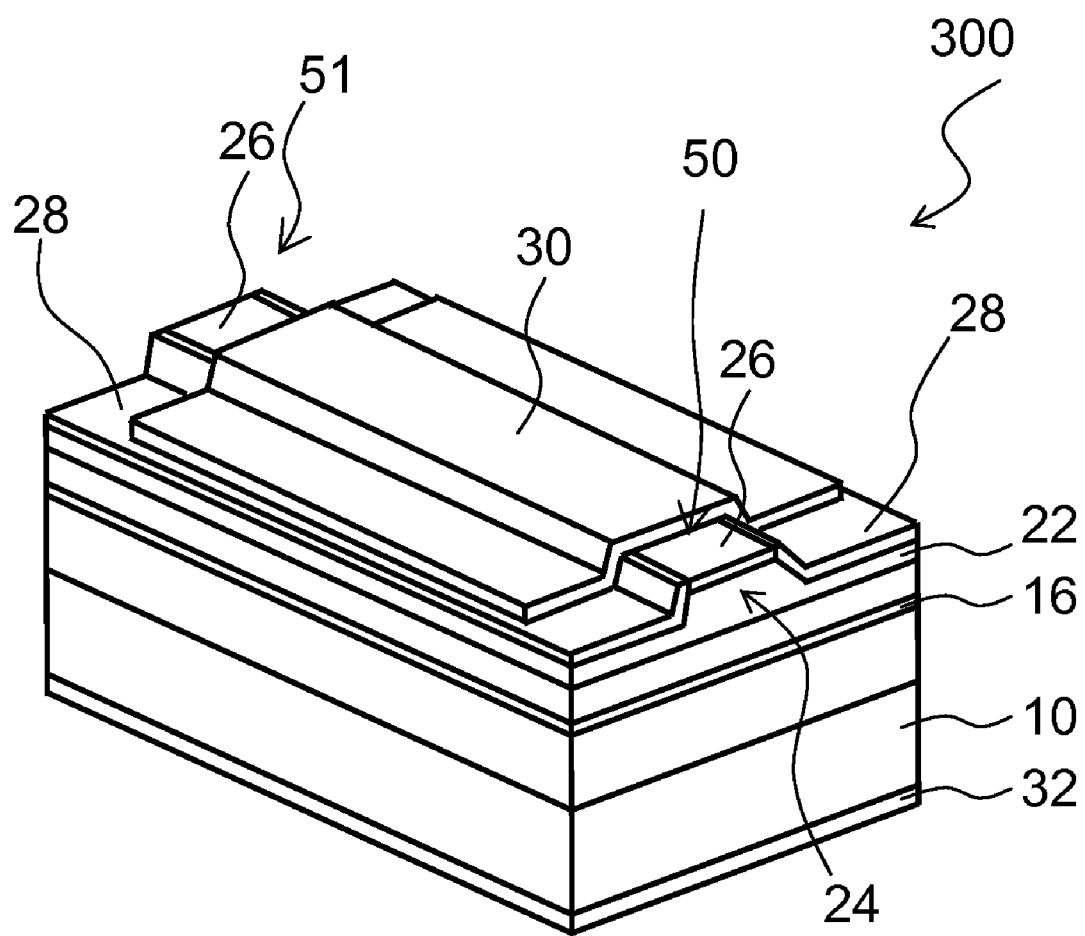
FIG. 13 is a perspective view of a semiconductor laser device in accordance with a third embodiment of the present invention.

FIG. 13 is a perspective view of a semiconductor laser device in accordance with a third embodiment of the present invention.

In this third embodiment, the upper electrode 30 is provided on the dielectric layer 28. In other words, the upper electrode 30 is extended to the side of the ridge waveguide 24. In case the upper electrode 30 is provided in the side of the ridge waveguide 24, it is difficult for the hydrogen to enter into the ridge waveguide 24 from the side of the ridge waveguide 24.

In accordance with these embodiments, the activation ratio of the P-type impurity in the first edge region is lower than that in that in the activation region.

In accordance with these embodiments, the activation ratio of the P-type impurity in the first edge region is lower than that in that in the activation region.

In the embodiments mentioned above, in the first region 50 and the second region 51, the hydrogen is introduced in the contact layer, the P-type clad layer, the P-type optical guide layer, the P-type overflow blocking layer, the active layer, the N-type optical guide layer and the N-the clad layer. However, it is available that in the first region 50 or the second region 51 the hydrogen is only one of the P-type semiconductor layers and the active layer, such as the contact layer, the P-type clad layer, the P-type optical guide layer, the P-type overflow blocking layer, the active layer.

In the embodiments mentioned above, the contact layer, the P-type clad layer, the P-type optical guide layer, the P-type overflow blocking layer and the active layer in the first region 50 and the second region 51 has a lower activation ratio of the P-type impurity than those in the activation region 52. However, it is available that only one of the contact layer, the P-type clad layer, the P-type optical guide layer, the P-type overflow blocking layer and the active layer in the first region 50 and the second region 51 has a lower activation ratio of the P-type impurity than that in the activation region 52.

In the embodiments mentioned above, in the first region 50 and the second region 51, the contact layer, the P-type clad layer, the P-type optical guide layer, the P-type overflow blocking layer and the active layer in the first region 50 and the second region 51 has a high resistance than those in the activation region 52. However, it is available that only one of the contact layer, the P-type clad layer, the P-type optical guide layer, the P-type overflow blocking layer and the active layer in the first region 50 and the second region 51 has a high resistance than that in the activation region 52.

In these embodiments, the semiconductor laser device is provided on the GaN substrate. However the semiconductor laser device may be provided on sapphire substrate by, for example, ELOG (Epitaxial Lateral Over Growth).

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor laser device provided between a first edge and a second edge opposite to the first edge and emitting laser from the first edge, comprising:
    a first clad layer of a first conductivity type having a nitride semiconductor;
    an active layer provided on the first clad layer and having a nitride semiconductor;
    a second clad layer of a second conductivity type provided on the active layer having a nitride semiconductor and a ridge waveguide, the ridge waveguide having an activation region and a first edge region, which is adjacent to the activation region and is extended from the first edge in a direction from the first edge to the second edge;
    an upper electrode provided on the ridge waveguide in the activation region; and
    a dielectric layer provided on a side surface of the ridge waveguide in the activation region,
    wherein the ridge waveguide in the first edge region has a lower activation ratio of a second conductivity type impurity than the ridge waveguide in the activation region.

2. A semiconductor light emitting device of claim 1, wherein the ridge waveguide has a second edge region which is adjacent to the activation region and is extended from the second edge in a direction from the second edge to the first edge, and
    wherein the ridge waveguide in the second edge region has a lower activation ratio of a second conductivity type impurity than the ridge waveguide in the activation region.

3. A semiconductor light emitting device of claim 1, wherein the activation ratio of the second conductivity type impurity in the activation region is no less than 7%, and the activation ratio of the second conductivity type impurity in the first edge region is less than 7%.

4. A semiconductor light emitting device of claim 2, wherein the activation ratio of the second conductivity type impurity in the activation region is no less than 7%, and the activation ratio of the second conductivity type impurity in the first edge region is less than 7%.

5. A semiconductor light emitting device of claim 1, further comprising a dielectric layer provided on a side of the ridge waveguide in the first edge region.

6. A semiconductor light emitting device of claim 2, further comprising a dielectric layer provided on a side of the ridge waveguide in the first edge region.

7. A semiconductor laser device provided between a first edge and a second edge opposite to the first edge and emitting laser from the first edge, comprising:
    a first clad layer of a first conductivity type having a nitride semiconductor;
    an active layer provided on the first clad layer and having a nitride semiconductor;
    a second clad layer of a second conductivity type provided on the active layer having a nitride semiconductor and a ridge waveguide, the ridge waveguide having an activation region and a first edge region, which is adjacent to the activation region and is extended from the first edge in a direction from the first edge to the second edge;
    an upper electrode provided on the ridge waveguide in the activation region; and
    a dielectric layer provided on a side surface of the ridge waveguide in the activation region,
    wherein the ridge waveguide in the first edge region has a lower hydrogen content than the ridge waveguide in the activation region.

8. A semiconductor light emitting device of claim 7, wherein the ridge waveguide has a second edge region which is adjacent to the activation region and is extended from the second edge in a direction from the second edge to the first edge, and
    wherein the ridge waveguide in the second edge region has a lower hydrogen content than the ridge waveguide in the activation region.

9. A semiconductor light emitting device of claim 7 wherein the ridge waveguide in the first edge region has a lower activation ratio of a second conductivity type impurity than the ridge waveguide in the activation region.

10. A semiconductor light emitting device of claim 8, wherein the ridge waveguide in the first edge region has a lower activation ratio of a second conductivity type impurity than the ridge waveguide in the activation region.

11. A semiconductor light emitting device of claim 8 wherein the ridge waveguide in the second edge region has a lower activation ratio of a second conductivity type impurity than the ridge waveguide in the activation region.

12. A semiconductor light emitting device of claim 10 wherein the ridge waveguide in the second edge region has a lower activation ratio of a second conductivity type impurity than the ridge waveguide in the activation region.

13. A semiconductor light emitting device of claim 9, wherein the activation ratio of the second conductivity type impurity in the activation region is no less than 7%, and the activation ratio of the second conductivity type impurity in the first edge region is less than 7%.

14. A semiconductor light emitting device of claim 12, wherein the activation ratio of the second conductivity type impurity in the activation region is no less than 7%, and the activation ratio of the second conductivity type impurity in the first edge region and the second ridge region is less than 7%.

* * * * *